United States Patent
Shimada

(10) Patent No.: US 11,054,949 B2
(45) Date of Patent: Jul. 6, 2021

(54) TOUCH DETECTION CIRCUIT, INPUT DEVICE AND ELECTRONIC APPARATUS

(71) Applicant: ROHM CO., LTD., Kyoto (JP)

(72) Inventor: Yuji Shimada, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/688,083

(22) Filed: Nov. 19, 2019

(65) Prior Publication Data

US 2020/0159352 A1    May 21, 2020

(30) Foreign Application Priority Data

Nov. 21, 2018 (JP) .............................. JP2018-217994

(51) Int. Cl.
G06F 3/045 (2006.01)
G06F 3/041 (2006.01)
G06F 3/044 (2006.01)
G01R 27/26 (2006.01)

(52) U.S. Cl.
CPC ......... G06F 3/044 (2013.01); G01R 27/2605 (2013.01)

(58) Field of Classification Search
CPC ....... G06F 3/044; G06F 3/0416; G06F 3/0412
See application file for complete search history.

(56) References Cited

U.S. PATENT DOCUMENTS

| 2011/0193817 A1* | 8/2011 | Byun | G06F 3/0418 345/174 |
| 2013/0063395 A1* | 3/2013 | Byun | G06F 3/0418 345/174 |

FOREIGN PATENT DOCUMENTS

| JP | 2001325858 A | 11/2001 |
| JP | 2012182781 A | 9/2012 |

* cited by examiner

*Primary Examiner* — Nan-Ying Yang
(74) *Attorney, Agent, or Firm* — Cantor Colburn LLP

(57) ABSTRACT

The present disclosure provides a touch detection circuit which comes with additional, new functions, an input device and an electronic apparatus.
N first terminals (Ps) are each connected with a corresponding first electrode (Es). A second terminal (Pc) is connected with a second electrode (Ec). N first capacitance detection circuits (210) correspond to the N first terminals (Ps), change voltages of the first terminals (Ps), respectively, and each generate a first detection signal indicating an electrostatic capacitance of the corresponding first electrode (Es) in accordance with movement of a charge produced in the corresponding first terminal (Ps). A cancelling circuit (240) driving the second terminal (Pc) in a manner that a voltage of the second terminal (Pc) follows a voltage of the first terminal (Ps). A second capacitance detection circuit (260) generating a second detection signal indicating an electrostatic capacitance of the second electrode (Ec).

12 Claims, 16 Drawing Sheets

US 11,054,949 B2

TOUCH DETECTION CIRCUIT, INPUT DEVICE AND ELECTRONIC APPARATUS

BACKGROUND OF THE INVENTION

Field of the Invention

The present disclosure relates to a detection circuit of electrostatic capacitance.

Description of the Prior Art

In recent years, an electronic apparatus, such as a computer, smartphone, tablet terminal, and portable audio apparatus, uses a touch-style input device as a client interface. The touch-style input device, such as a conventional touch panel and a pointing device, receives various inputs by a user's finger, a stylus held by the user, or the user's approaching the touch-style input device.

In general, the touch-style input devices come in two categories: resistance film style and electrostatic capacitance style. The electrostatic capacitance style involves converting variations in electrostatic capacitance (hereinafter abbreviated as capacitance) generated by a plurality of sensor electrodes into electrical signals according to a user's input, so as to detect for the presence of the user's input and coordinates thereof.

In general, methods for electrostatic capacitance detection come in two categories: self-capacitance type and mutual-capacitance type. The self-capacitance type is highly sensitive, as it not only detects a touch but also detects the approach of a finger; however, it is not only unable to discern any water drops attached to the touch-style input devices but also fails to detect a two-point touch. By contrast, the mutual-capacitance style is advantageously able to detect a two-point touch (or a multi-point touch) and insusceptible to water drops. Therefore, it is advisable to choose between the self-capacitance type, the mutual-capacitance style, and both, according to a purpose.

FIG. 1 is a block diagram of a self-capacitance type touch-style input device 100R. The touch-style input device 100R comprises a touch panel (or touch switch) 110 and a touch detection circuit 200R. The touch panel 110 comprises a sensing electrode 112 and a mask 114. The mask 114 is grounded. The sensing electrode 112 is connected to a sensing (SNS) terminal of the touch detection circuit 200R. When a user's finger or stylus approaches or contacts the sensing electrode 112, electrostatic capacitance Cs generated by the sensing electrode 112 increases. The touch detection circuit 200R detects for the presence of a touch and coordinates thereof in accordance with variations in the electrostatic capacitance Cs.

The touch detection circuit 200R comprises a capacitance detection circuit 210 and an A/D (analog/digital) converter 230. The capacitance detection circuit 210 enables the SNS terminal to undergo voltage variation, charging or discharging electrostatic capacitance Cs. At this point, movement of charges occurs in response to voltage variation of the SNS terminal. The capacitance detection circuit 210 generates a detection signal $V_S$ corresponding to the amount of the moving charges. The A/D converter 230 converts the detection signal $V_S$ into a digital value. The digital value is inputted to a processor (not shown), such as a microcomputer, to determine whether a touch has occurred or not and its coordinates.

Parasitic capacitance Cp exists between the sensing electrode 112 and the mask 114. The electrostatic capacitance measured with the touch detection circuit 200R is synthetic capacitance of the electrostatic capacitance Cs and the parasitic capacitance Cp. The parasitic capacitance Cp lessens the dynamic range of the electrostatic capacitance Cs measurable in the touch detection circuit 200R. Therefore, there is a need to reduce the effect of the parasitic capacitance Cp. The parasitic capacitance Cp can be reduced by reducing the area of the mask 114. However, it is impossible to dispense with the mask 14 completely, because the mask 114 is capable of blocking out noise from electronic circuits disposed at the bottom of the touch panel 110

FIG. 2 is a block diagram of the self-capacitance type touch-style input device 100S. The touch detection circuit 200S further comprises a terminal SLD connected to the mask 114 such that the electric potential of the SLD terminal and the electric potential of the SNS terminal are correlated. Specifically speaking, the input of a buffer 202 receives the electric potential of the SNS terminal, and the output of the buffer 202 generates the electric potential of the SNS terminal. Therefore, electric potential difference between the sensing electrode 112 and the mask 114 is kept constant, so as to preclude charge movement otherwise arising from the parasitic capacitance Cp. Therefore, the effect of the parasitic capacitance Cp is eliminated, and thus only the electrostatic capacitance Cs generated as a result of a touch is detected.

PRIOR ART DOCUMENT

Citation Document

[Citation Document 1] Japan published patent application 2001-325858.

[Citation Document 2] Japan published patent application 2012-182781.

SUMMARY OF THE INVENTION

Problem to be Solved by Present Disclosure

The present disclosure is accomplished in the aforesaid situation. One of exemplary objectives of one aspect of the present disclosure is to provide a touch detection circuit which comes with additional, new functions.

Technical Means to Solve Problem

An aspect of the present disclosure relates to a self-capacitance type touch detection circuit. The touch detection circuit comprises: N (N≥1) first terminals, each connected with a corresponding first electrode; a second terminal, connected with a second electrode; N first capacitance detection circuits, corresponding to the N first terminals, changing voltages of the first terminals, respectively, and each generating a first detection signal indicating an electrostatic capacitance of the corresponding first electrode in accordance with movement of a charge produced in the corresponding first terminal; a cancelling circuit, driving the second terminal in a manner that a voltage of the second terminal follows a voltage of the first terminal; and a second capacitance detection circuit, generating a second detection signal indicating an electrostatic capacitance of the second electrode.

Furthermore, an invention which results from any combination of the aforesaid constituent elements and an invention which results from transforming descriptions of the present disclosure between a method and a device are deemed effective aspects of the present disclosure.

Effect of Present Disclosure

The present disclosure provides a touch detection circuit which comes with additional new functions.

DETAILED DESCRIPTION OF THE EMBODIMENTS

Overview of Embodiments

Figure 1:
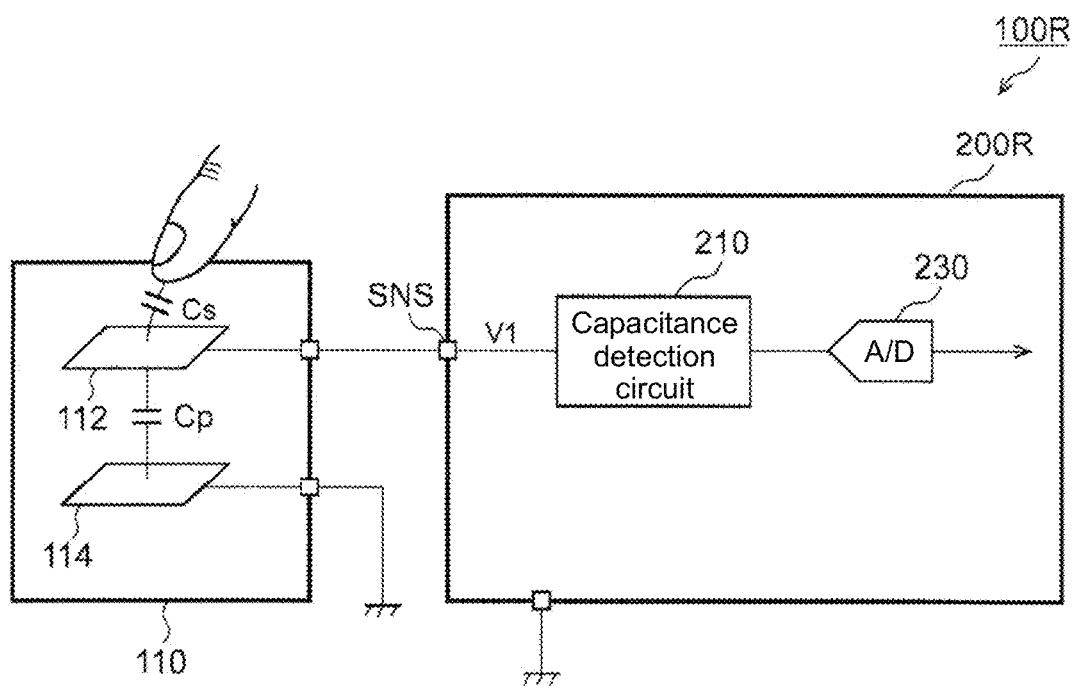
FIG. 1 (PRIOR ART) is a block diagram of a self-capacitance type touch-style input device.

A self-capacitance type touch detection circuit according to an embodiment of the present disclosure is hereunder described. The touch detection circuit comprises: N (N≥1) first terminals, a second terminal, N first capacitance detection circuits, a cancelling circuit, and a second capacitance detection circuit. The N first terminals are each connected with a corresponding first electrode. The second terminal is connected with a second electrode. The N first capacitance detection circuits correspond to the N first terminals, change voltages of the first terminals, respectively, and each generates a first detection signal indicating an electrostatic capacitance of the corresponding first electrode in accordance with movement of a charge produced in the corresponding first terminal. The cancelling circuit drives the second terminal in a manner that a voltage of the second terminal follows a voltage of the first terminal. The second capacitance detection circuit generates a second detection signal indicating an electrostatic capacitance of the second electrode.

In an embodiment, the second electrode for cancelling a parasitic capacitance is used in touch detection or approach detection.

The second capacitance detection circuit generates the second detection signal in accordance with a movement of a charge produced in the second terminal driven by the cancelling circuit. Therefore, the electrostatic capacitance of the second electrode is monitored in synchrony with the monitor of the electrostatic capacitance of the first electrodes.

The area of the second electrode is greater than the area of the first electrode. Therefore, high-sensitivity sensing is achieved.

The cancelling circuit includes a buffer. The buffer has an input receiving the voltages of the first terminals and an output connecting with the second terminal. The second capacitance detection circuit includes an integrating circuit for integrating an output current of the buffer.

The buffer includes a push-pull type output section. The push-pull type output section comprises a high-side transistor and a low-side transistor. The integrating circuit integrates currents flowing in the high-side transistor and the low-side transistor, respectively.

An action parameter and/or an action mode of the touch detection circuit is controlled according to the second detection signal. For example, an action parameter of the N first capacitance detection circuits is controlled according to the second detection signal.

The action parameter is an action frequency of the first capacitance detection circuit, that is, the frequency of voltages generated by the first terminals. If the noise of the second detection signal is large, the effect of the noise can be reduced by changing the action frequency.

N≥2, and the second electrode is disposed in such a manner as to overlap the N first electrodes. Therefore, the parasitic capacitance of all the N first electrodes can be canceled with one second electrode. Furthermore, the area of the second electrode may be large. Therefore high-sensitivity sensing is achieved.

N≥2, and the N first capacitance detection circuits are activated sequentially with time division, and the N first detection signals are generated sequentially, the non-activated first capacitance detection circuits is synchronized with the activated first capacitance detection circuit and may modify the voltages of the corresponding first terminals.

The touch detection circuit is integrally integrated into a semiconductor integrated circuit. The "integral integration" applies to the embodiment where all the constituent elements of the circuit are formed on a semiconductor substrate, the embodiment where main constituent elements of the circuit are integrally integrated, and the embodiment where some resistors and capacitors for use in regulation of circuit constants may be disposed on outer portion of the semiconductor substrate. It is feasible to reduce circuit area and maintain uniformity of characteristics of circuit components by integrating the circuit into one chip.

Another aspect of the present disclosure relates to an input device. The input device comprises: a touch panel having a plurality of sensor electrodes for sensing electrostatic capacitance variation in the sensor electrodes adjacent to the coordinates contacted by a user; and any of the touch detection circuit mentioned above.

Embodiment

The present disclosure is hereunder described in accordance with preferred embodiments and with reference made to the accompanying drawings. In each of the accompanying drawings, the same or equivalent constituent elements, members, and processes are denoted by the same reference numeral/sign, and properly repeated explanations are omitted. The embodiments are not restrictive of the invention but merely serve exemplary purposes. All features described hereunder and any combination of the features are not essential features of the invention.

The expression "connection of member A and member B" also means direct physical connection of member A and member B. Furthermore, the expression "connection of member A and member B" also means indirect connection of member A and member B, in the presence of any other member(s) disposed between members A, B without having any essential effect on the state of electrical connection of members A, B or jeopardizing any function or advantage jointly achieved by members A, B.

Likewise, the expression "member C is disposed between member A and member B" also means direct connection of member A and member C or direct connection of member B and member C. Furthermore, the expression "member C is disposed between member A and member B" also means indirect connection of members A, B and C, in the presence of any other member(s) disposed between members A, B and C without having any essential effect on the state of electrical connection of members A, B and C or jeopardizing any function or advantage jointly achieved by members A, B and C.

Figure 3:
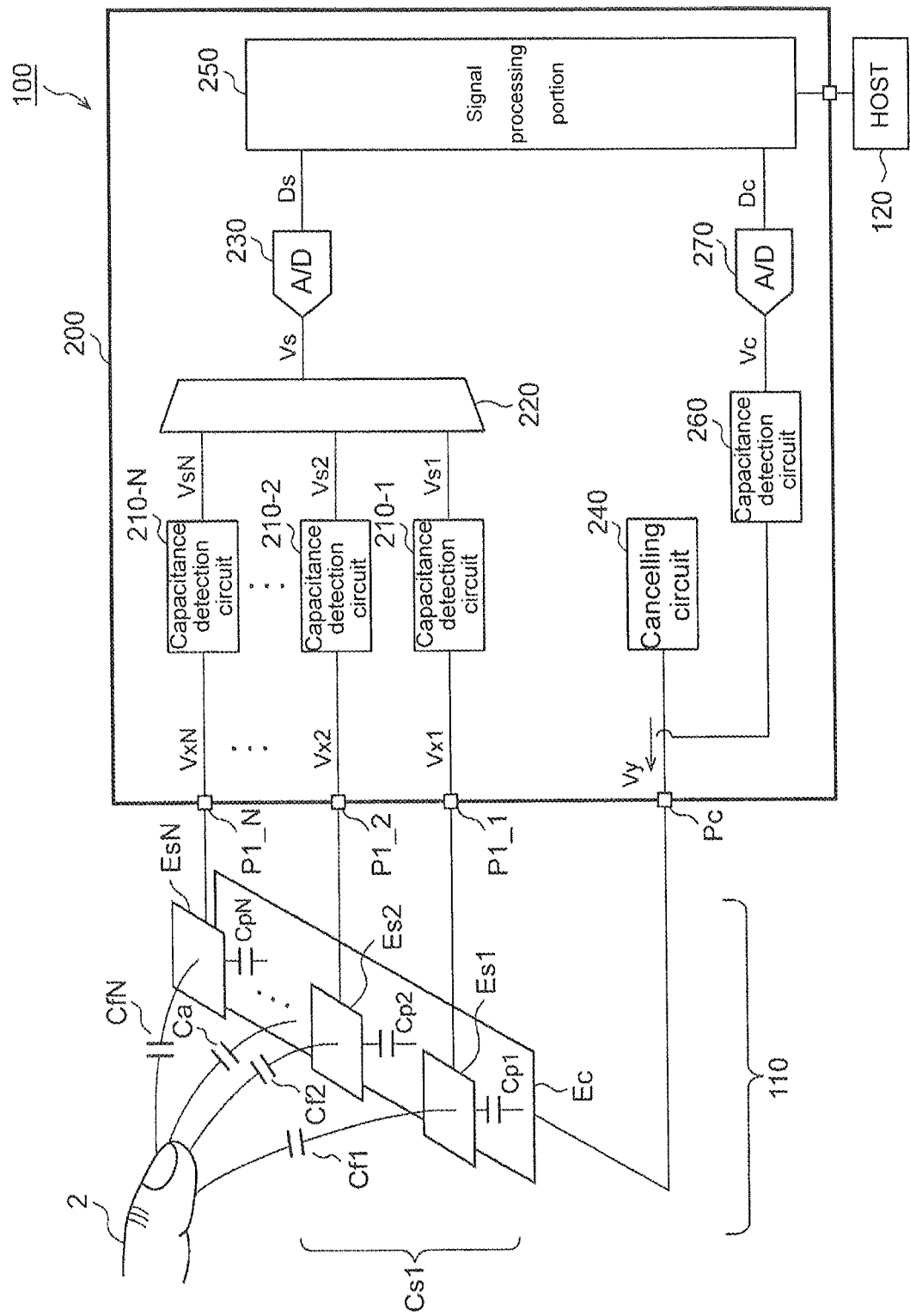
FIG. 3 is a block diagram of a touch-style input device comprising a touch detection circuit according to an embodiment of the present disclosure.

FIG. 3 is a block diagram of a touch-style input device 100 comprising a touch detection circuit 200 according to an embodiment of the present disclosure. The touch-style input device 100 is a user interface for detecting touch operation carried out with a finger 2 (or stylus) of a user.

The touch input device 100 comprises a panel 110, a host processor 120 and the touch detection circuit 200. The panel 110 is a touch panel or switch panel, comprising N (N≥1) first electrodes (sensing electrodes) Es~Es_N and second electrodes (cancelling electrodes) Ec. In this embodiment, the touch input device 100 is a multi-channel (N≥2) electrostatic switch. The second electrode Ec overlaps N first electrodes Es1~EsN.

The host processor 120 coordinates and controls an apparatus, device, and/or system operating in conjunction with the touch input device 100. The touch detection circuit 200 is configured to send the state of the panel 110, such as the input (approach) to the panel 110 and the position of a touch (or ID of a button touched), to the host processor 120.

The touch detection circuit 200 has N-channels and detects electrostatic capacitance Cs1~CsN produced respectively by the N first electrodes Es1~EsN. The electrostatic capacitance Cs not only includes electrostatic capacitance Cf between the first electrode and the finger 2 but also includes parasitic capacitance Cp produced between the first electrode and the second electrode Ec (or any other object).

When the finger 2 contacts (or approaches) the first electrode Esi corresponding to the ith channel, electrostatic capacitance Cfi increases, whereas electrostatic capacitance Csi increases relative to electrostatic capacitance Csj (j≠i) corresponding to the other channels. The touch detection circuit 200 monitors electrostatic capacitance Cs corresponding to each channel. When the absolute value of electrostatic capacitance Csi corresponding to the ith channel exceeds a predetermined threshold value (or when the variation relative to the other channels exceeds the threshold value), it is determined that a touch input exists in the ith channel.

The general structure of the touch input device 100 is described above. The constituent elements of the touch detection circuit 200 are described below.

The touch detection circuit 200 comprises N first terminals Ps1~PsN, a second terminal Pc, N first capacitance detection circuits 210_1~210_N, a selector 220, a first A/D converter 230, a cancelling circuit 240, a signal processing portion 250, a second capacitance detection circuit 260, and a second A/D converter 270, which are integrated into a semiconductor chip and contained in a package.

The N (N≥1) first terminals Ps are each connected with a corresponding first electrode Es. Furthermore, the second terminal Pc is connected with the second electrode Ec.

The N first capacitance detection circuits 210 correspond to the N first terminals Ps and the N first electrodes Es, respectively. The first capacitance detection circuits 210 are each a C/V (capacitance/voltage) converter. The ith first capacitance detection circuit 210_i enables voltage Vsi of the corresponding first terminal Ps1 to change and generates a first detection signal Vsi indicating electrostatic capacitance Csi of the corresponding first electrode Esi in accordance with movement of a charge produced in the corresponding first terminal Ps.

The cancelling circuit 240 drives the second terminal Pc and the second electrode Ec in a manner that a voltage Vy of the second terminal Pc follows a voltage Vx of the first terminals Ps. In this embodiment, the voltages Vx1~VxN of the first terminals Ps1~PsN corresponding to all the channels are controlled to be of the same voltage level (waveform). Therefore, the cancelling circuit 240 cancels parasitic capacitance between adjacent first electrodes Es. The cancelling circuit 240 enables the voltage Vy of the second terminal Pc to follow any one (such as Vx1) of the voltages Vx1~VxN. Therefore, the cancelling circuit 240 equalizes the voltages Vx1~VxN and Vy among all the electrodes.

The first capacitance detection circuits 210_1~210_N are activated with time division. The selector 220 selects the first detection signal Vs of the activated channels. The first A/D converter 230 converts output Vs of the selector 220 into digital detection data Ds. The sequence of the detection data Ds recursively expresses electrostatic capacitance Cs1~CsN.

The signal processing portion 250 processes detection data Ds and thereby determines whether any one of the first electrodes Es1~EsN is touched or not. The determination result is sent to the host processor 120.

As described below, the cancelling circuit 240 may comprise a buffer (voltage follower) which has an input receiving voltage Vs1 and an output connected to the second terminal Pc. Therefore, the voltage Vy of the second terminal Pc may accurately follow the voltage Vs1.

The second capacitance detection circuit 260 generates a second detection signal Vc indicating electrostatic capacitance Cc produced in the second electrode Ec. The electrostatic capacitance Cc includes not only parasitic capacitance Cp1~CpN produced between the second electrode Ec and the first electrodes Es1~EsN but also capacitance Ca produced between the second electrode Ec and the finger 2.

Preferably, the second capacitance detection circuit 260 detects electrostatic capacitance Cc in accordance with movement of a charge produced in the second terminal Pc as a result of the cancelling circuit 240 driving the second electrode Ec. The second A/D converter 270 converts the second detection signal Vc into digital value Dc. The signal processing portion 250 determines, in accordance with digital value Dc, whether the finger 2 approaches (or contacts) the panel 110 or not.

Figure 4:
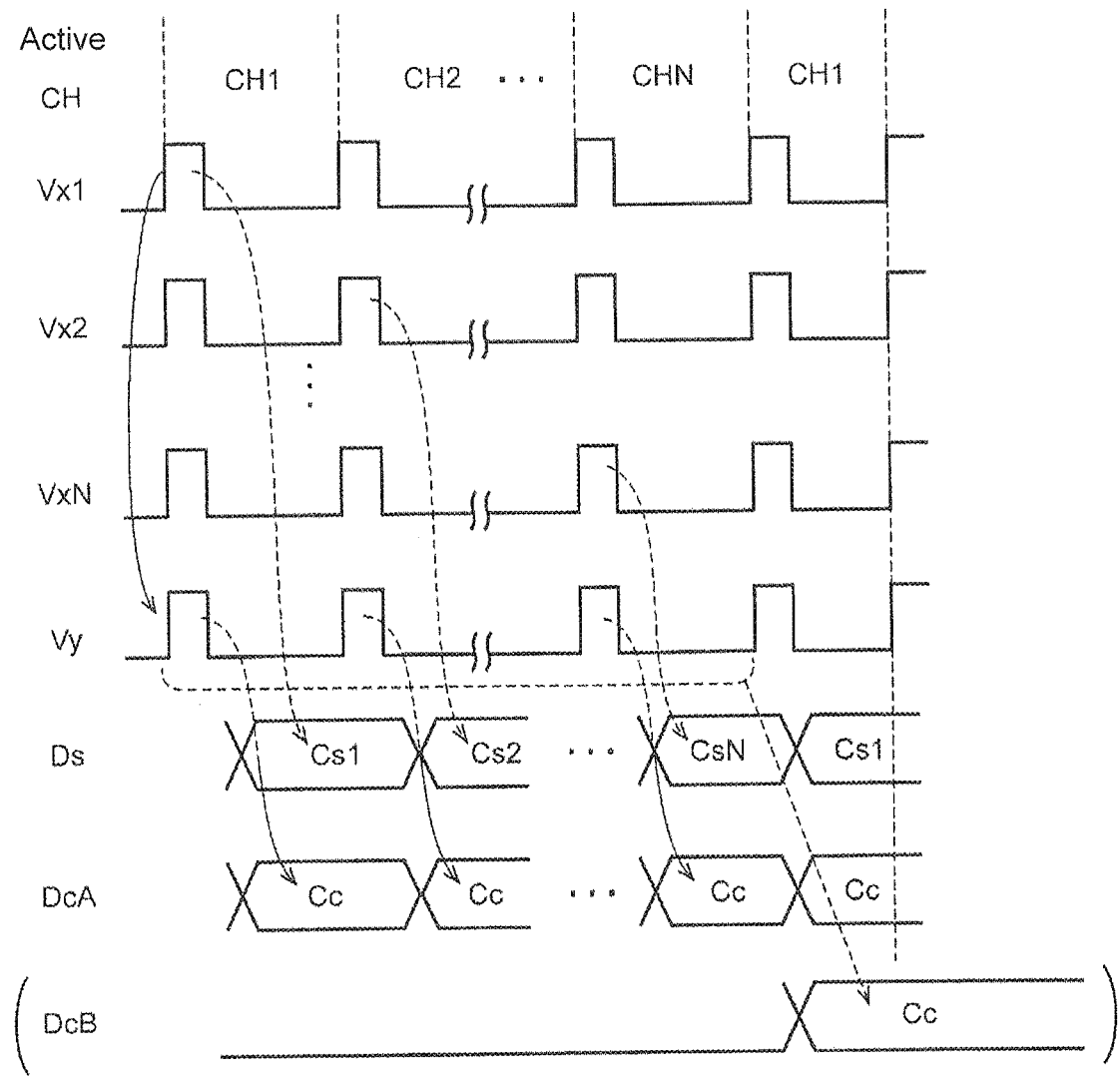
FIG. 4 is an action waveform diagram of the touch detection circuit of FIG. 3 operating in a first mode.

The constituent elements of the touch detection circuit 200 are described above. The action of the touch detection circuit 200 is described below. FIG. 4 is an action waveform diagram of the touch detection circuit 200 of FIG. 3 operating in a first mode.

The activated channels recursively switch between CH1~CHN with time division. The first capacitance detection circuit 210_$i$ corresponding to the activated channel CHi (i=1, 2 . . . , N) drives the corresponding first terminal Psi and generates the detection signal Vsi indicating electrostatic capacitance Csi. Then, the first A/D converter 230 converts the detection signal Vsi into digital signal Dsi.

During the sensing time period of the first capacitance detection circuit 210_$i$, the voltage Vxi of the first terminal Psi is changed into pulse-shaped. Furthermore, as shown in FIG. 4, the waveform of voltage Vx is simplified. In fact, the actual waveform of the voltage Vx corresponds to the detection mechanism and circuit structure of the first capacitance detection circuits 210.

The first capacitance detection circuits 210_$j$ (j≠i) of the remained non-activated channels also drive the corresponding first terminals Psj, and the voltages Vx1~VxN of all the channels have the same waveform. Furthermore, regarding the non-activated channels, only the driving of the first terminals Psj is effective, but the sensing itself is rendered ineffective.

In the embodiment illustrated by FIG. 4, during the sensing time period of one channel, the voltage Vx of the first terminals Ps includes one pulse. In another embodiment, the voltage Vx of the first terminals Ps may include a plurality of pulses. Under the aforesaid condition, by summing or averaging the sensing results obtained by means of the pulses may lead to decreasing of the sensing frequency, but the high-precision sensing also becomes possible.

The cancelling circuit 240 enables the voltage Vy of the second terminal Pc to follow variation in the voltages Vx1~VxN. Therefore, the voltages Vx1~VxN and Vy have the same waveform. Therefore, the effect of the parasitic capacitance Cp1~CpN produced between the second electrode Ec and first electrode Es1~EsN is canceled.

In the first mode, the second capacitance detection circuit 260 senses capacitance Cc of the second electrode Ec while the cancelling action is taking place. For example, the sensing time period of the second capacitance detection circuit 260 is equal to the sensing time period of the first capacitance detection circuit 210 corresponding to one channel. Under the aforesaid condition, as indicated by DcA shown in the diagram, the value of digital value DcA is updated in every instance of the switching of the activated channels.

An action of the first mode of the touch detection circuit 200 is described above. By the touch detection circuit 200, the effect of parasitic capacitance Cp1~CpN may be canceled through the second terminal Pc driven by the cancelling circuit 240, so as to enhance the precision of detection of electrostatic capacitance Cf1~CfN between the first electrode and the initial detection subject, i.e., the finger 2.

Furthermore, the second electrode Ec for cancelling parasitic capacitance may be applied to the detection of the finger 2. As shown in FIG. 3, the area of the second electrode Ec is greater than the area of the first electrode Es; hence, the second electrode Ec may obtain high detection sensitivity. It is not only for detecting a touch from the finger 2, but also for use as an approach sensor.

Furthermore, in the first mode, the present disclosure further has an advantage: the sensing of the second electrode Ec may occur concurrently with the sensing of the first electrodes Es.

The sensing time period of the second capacitance detection circuit 260 is equal to the sensing time period of the first capacitance detection circuit 210 corresponding to a plurality of channels. Under the aforesaid condition, as indicated by DcB shown in the diagram, at the end of the sensing time period of a plurality of channels (CH1~CHN in this embodiment), value of digital value DcB is updated. Under the aforesaid condition, the voltage Vy of the second terminal Pc includes a plurality of pulses during the sensing period performed by the second capacitance detection circuit 260, and by summing or averaging the sensing results obtained by means of the plurality of pulses may lead to decreasing of the sensing frequency, but the high-precision sensing also becomes possible.

Figure 5:
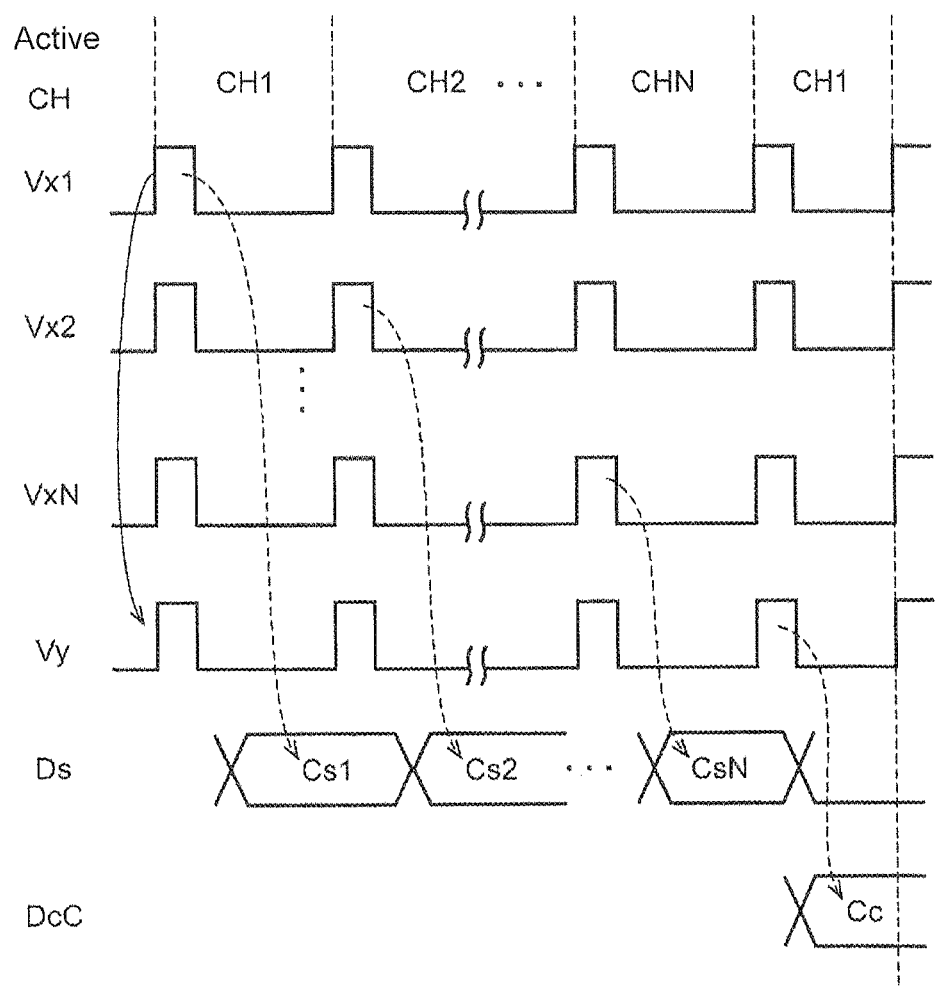
FIG. 5 is an action waveform diagram of the touch detection circuit of FIG. 3 operating in a second mode.

The touch detection circuit 200 may support the action of the second mode in addition to the action of the first mode or may substitute for the action of the first mode. FIG. 5 is an action waveform diagram of the touch detection circuit 200 of FIG. 3 operating in a second mode. In the second mode, the sensing of the first electrode Es and the sensing of the second electrode Ec is carried out exclusively. For example, it may be controlled in the following manner, the sensing of the first electrode Es stops and the sensing of the second electrode Ec continues, upon detection of the approach of the finger 2, the sensing of the second electrode Ec stops, and the sensing of the first electrodes Es starts, such that the position of the touched switch is determined.

An action parameter of the N first capacitance detection circuits 210 of the touch detection circuit 200 is controlled according to the second detection signal Vc.

For example, an action parameter of the first capacitance detection circuits 210 is the driving frequency (frequency of voltage Vx) of the first capacitance detection circuits 210. For example, when the first capacitance detection circuits 210 performs sensing at a specific frequency and the second detection signal Vc contains lots of noises, a noise source with the same frequency as the driving frequency may exist. Therefore, if the noise carried by the second detection signal Vc exceeds an allowed level, the driving frequency of the first capacitance detection circuits 210 is better to be changed. Therefore, the effect of noise may be reduced.

Another changeable action parameter is exemplified by a threshold value of a touch detection for the N first electrodes. The signal processing portion 250 determines a touch input for the button of the channel when detection signal Dsi (or the extent of variation) of each channel CHi exceeds the threshold value. Under the aforesaid condition, the threshold value for touch detection of the button of each channel decreases when the approach (or touch) of the finger 2 is detected by means of the sensing of the second capacitance detection circuit 260 and the second electrode Ec. False detection of the touch of the button is prevented by setting the threshold value to a higher value before detection of the approach of the finger 2. Therefore, tolerance to ambient noise is enhanced.

The present disclosure relates to various devices and methods defined by circuit diagrams and the block diagram of FIG. 3 or inferred by the description but is not restricted to specific structures. Specific structural examples and embodiments are described below and intended to render the essential technical features and actions comprehensible and clear rather than reduce the scope of the present disclosure.

Embodiment 1

Figure 6:
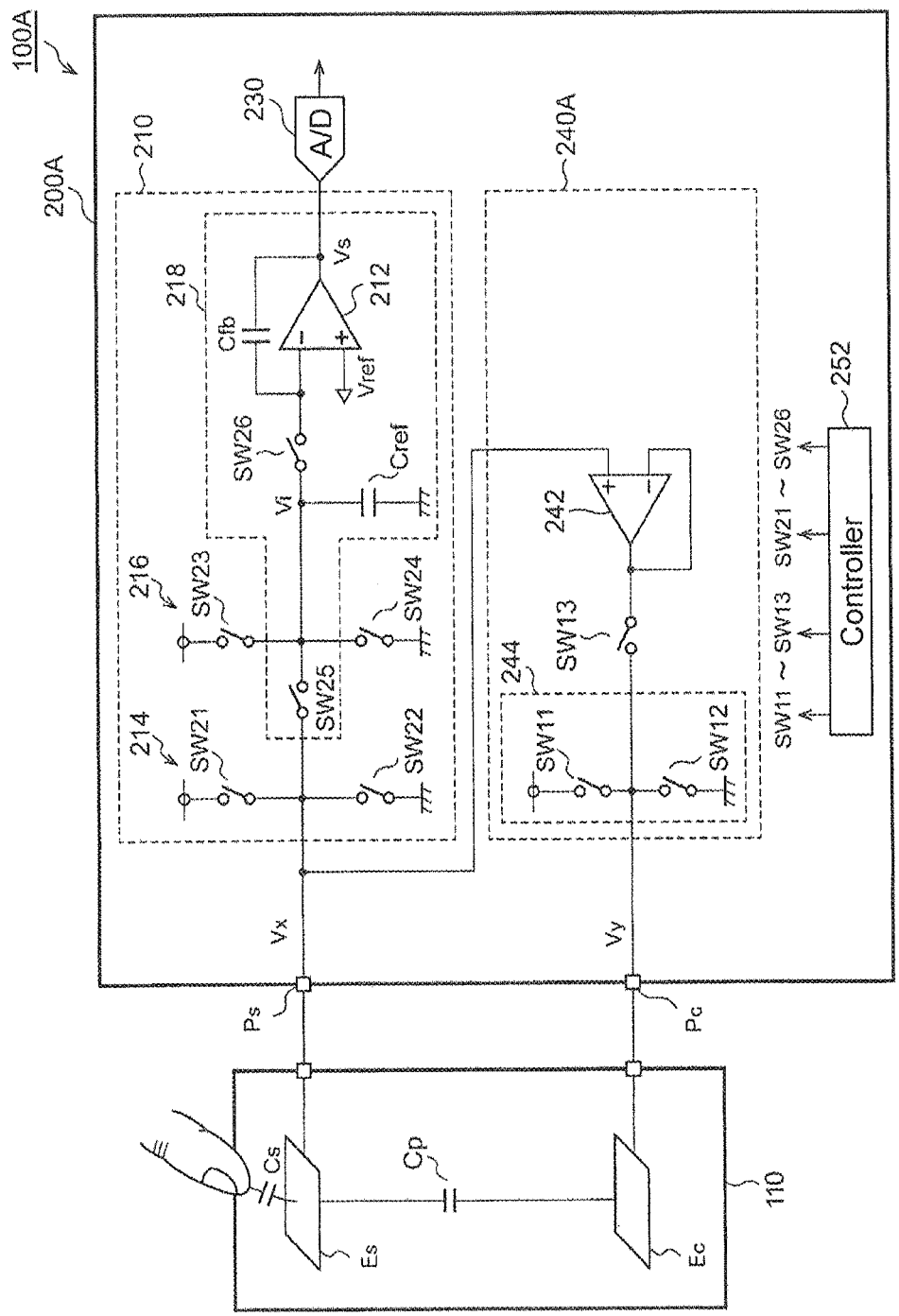
FIG. 6 is a circuit diagram of the touch detection circuit in embodiment 1.

FIG. 6 is a circuit diagram of the touch detection circuit 200A in embodiment 1. The circuit diagram shows the structure of one channel only. The capacitance detection circuit 210A comprises a plurality of switches SW21~SW26, an operational amplifier 212, standard capacitance Cref, and feedback capacitance Cfb. One end of standard capacitance Cref is grounded. The other end of standard capacitance Cref is connected to the first terminals Ps via the charge transmission switch SW25 and connected to inverse input terminal (−) of the operational amplifier 212 via the amplification switch SW26.

The switches SW25, SW26, standard capacitance Cref, feedback capacitance Cfb and operational amplifier 212 form an integrator 218 which uses a switch capacitor. Standard voltage Vref is inputted to non-inverse input terminal (+) of the operational amplifier 212, and the feedback capacitance Cfb is disposed between the output of the operational amplifier 212 and the inverse input terminal.

The switch pair of an upper switch SW21 and a lower switch SW22 forms a first driving portion 214 whereby voltage of the first terminals Ps varies between power supply voltage Vdd and ground voltage 0 V.

The switch pair of an upper switch SW23 and a lower switch SW24 forms a second driving portion 216 whereby voltage Vi of the standard capacitance Cref varies between power supply voltage Vdd and ground voltage 0 V.

The switches SW21~SW26 are controlled by a controller 252. The controller 252 is a constituent part of the signal processing portion 250. Preferably, Vref is configured to be expressed as Vdd/2. An initialization switch (not shown) is parallel-connected to feedback capacitance Cfb.

During (i) driving time period, the capacitance detection circuit 210 turns off the charge transmission switch SW25, under the state of separating the first terminals Ps from standard capacitance Cref, applies one of power supply voltage Vdd and ground voltage 0 V to the first terminals Ps, and applies the other one of power supply voltage Vdd and ground voltage 0 V to standard capacitance Cref.

During the subsequent sensing time period, the capacitance detection circuit 210 only has the charge transmission switch SW25 turned on, and connecting the first terminals Ps to standard capacitance Cref. As a result, movement of a charge between electrostatic capacitance Cs and standard capacitance Cref occurs. If, during the preceding driving time period, power supply voltage Vdd is applied to the first terminals Ps, and ground voltage 0 V is applied to standard capacitance Cref, equations (1), (2) below are established under the law of conservation of charge.

$$Cs \times Vdd = Vi \times (Cs + Cref) \quad (1)$$

$$Vi = Vdd \times Cs / (Cs + Cref) \quad (2)$$

Vi denotes the voltage of standard capacitance Cref after termination of movement of a charge. If Cs=Cref, then Vi=Vdd/2.

During the subsequent amplification time period, the amplification switch SW26 is turned on. Hence, feedback capacitance Cfb is charged when the voltage of the inverse input terminal of the operational amplifier 212 becomes Vref, so as to obtain detection voltage Vs expressed by equation (3) below.

$$Vs = Vref - Cref/Cfb \times (Vi - Vref) \quad (3)$$

As indicated by equations (2), (3), detection voltage Vs depends on electrostatic capacitance CsA.

A driving auxiliary circuit 244 of the cancelling circuit 240A comprises a first switch SW11 and a second switch SW12. The first switch SW11 is disposed between the second terminal Pc and the power line. The second switch SW12 is disposed between the second terminal Pc and the ground line. The first switch SW11 is connected to and in communication with the upper switch SW21 of the first driving portion 214, increasing the voltage Vy of the second terminal Pc to power supply voltage Vdd. Furthermore, the second switch SW12 is connected to and in communication with the lower switch SW22 of the first driving portion 214, decreasing the voltage Vy of the second terminal Pc to ground voltage 0 V.

Figure 7:
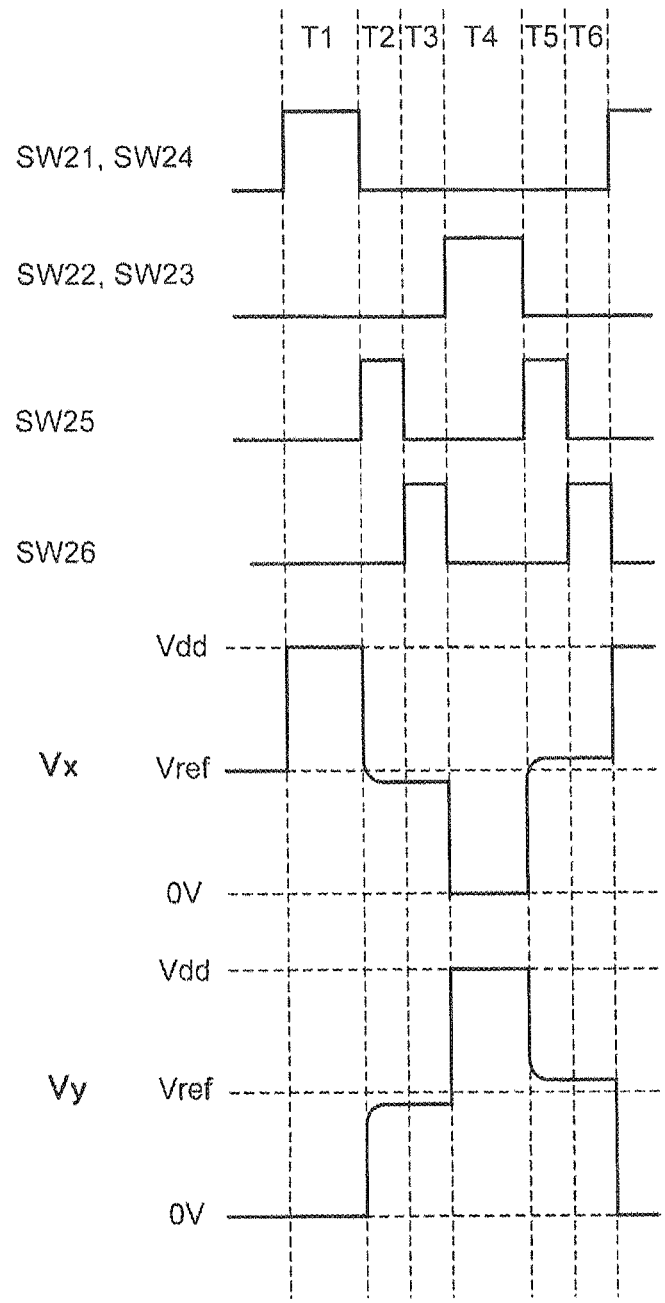
FIG. 7 is an action waveform diagram of a capacitance detection circuit of FIG. 6.

FIG. 7 is an action waveform diagram of a capacitance detection circuit 210A of FIG. 6. During the driving time period T1, the upper switch SW21 and the lower switch SW24 are turned on, the power supply voltage Vdd is applied to the first terminals Ps, and the ground voltage 0 V is applied to the standard capacitance Cref. During the subsequent transmission time period T2, the charge transmission switch SW25 is turned on, averaging the charges of standard capacitance Cref and electrostatic capacitance Cs. The voltage Vi of standard capacitance Cref is expressed by the equation below.

$$Vi = Vdd \times Cs / (Cs + Cref)$$

During the subsequent amplification time period T3, the charge transmission switch SW25 is turned off, and the voltage Vi remains unchanged. The amplification switch SW26 is turned on, generating the detection voltage Vs.

During the subsequent driving time period T4, the lower switch SW22 and the upper switch SW23 are turned on, the ground voltage 0 V is applied to the first terminals Ps, and the power supply voltage Vdd is applied to the standard capacitance Cref. During the subsequent transmission time period T5, the charge transmission switch SW25 is turned on, averaging the charges of standard capacitance Cref and electrostatic capacitance Cs.

$$Vi = Vdd \times Cref / (Cs + Cref)$$

During the subsequent amplification time period T6, the charge transmission switch SW25 is turned off, and the voltage Vi remains unchanged. The amplification switch SW26 is turned on, generating the detection voltage Vs.

Figure 8:
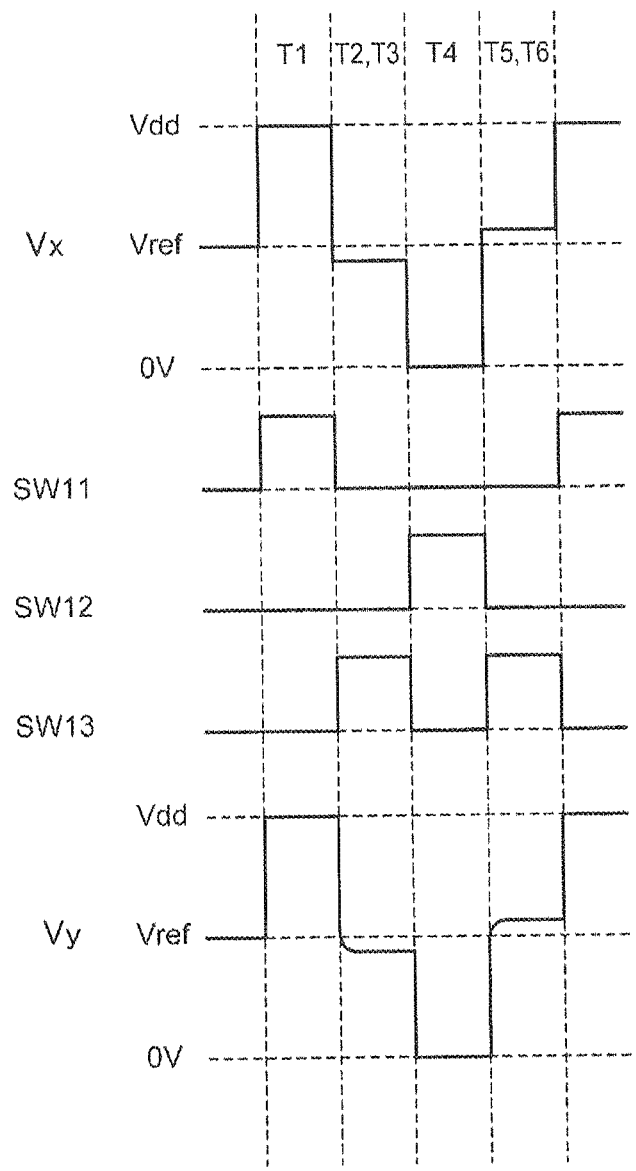
FIG. 8 is an action waveform diagram of the touch detection circuit.

FIG. 8 is an action waveform diagram of the touch detection circuit 200. During the driving time period T1, the voltage Vx of the first terminals Ps increases to power supply voltage Vdd. Accordingly, the first switch SW11 is turned on such that the voltage Vy of the second terminal Pc follows voltage Vx and increases to power supply voltage Vdd.

During the transmission time period T2 and the amplification time period T3, a third switch SW13 is turned on such that the second terminal Pc is connected to the output of a buffer 242. As a result, owing to the buffer 242, the voltage Vy of the second terminal Pc becomes equal to the voltage Vx of the first terminals Ps.

During the driving time period T4, the voltage Vx of the first terminals Ps decreases to ground voltage 0 V. Accordingly, the second switch SW12 is turned on such that the voltage Vy of the second terminal Pc follows the voltage Vx and decreases to ground voltage 0 V.

During the transmission time period T5 and the amplification time period T6, the third switch SW13 is turned on, the second terminal Pc is connected to the output of the buffer 242. As a result, owing to the buffer 242, the voltage Vy of the second terminal Pc becomes equal to the voltage Vx of the first terminals Ps.

An action of the touch detection circuit 200A is described above. The touch detection circuit 200A enables the voltage Vy of the second terminal Pc to rapidly follow the voltage Vx of the first terminals Ps, cancelling the effect of parasitic capacitance Cp between the first electrode Es and the second electrode Ec.

Figure 2:
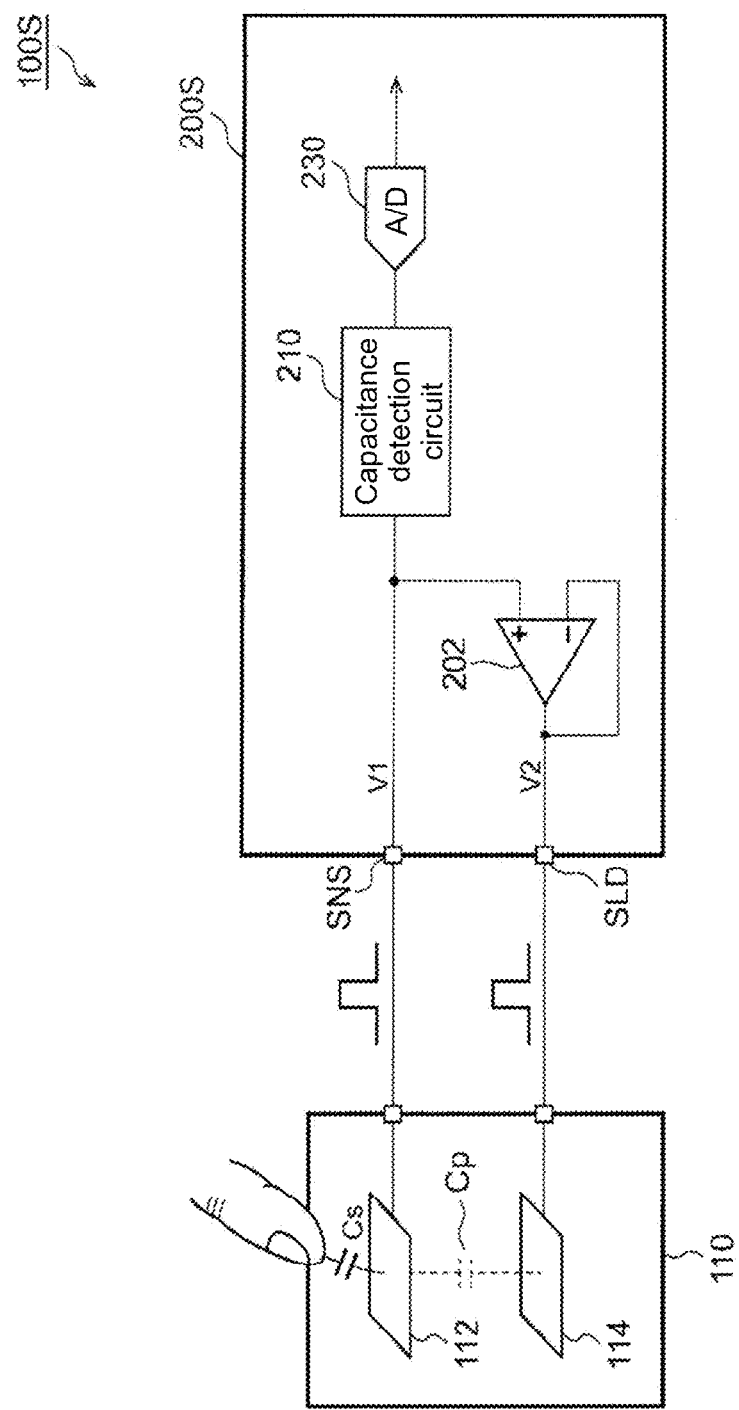
FIG. 2 (PRIOR ART) is a block diagram of the self-capacitance type touch-style input device.

At the start of the driving time period T1, the driving auxiliary circuit 244 replaces the buffer 242, causing the voltage Vy to increase abruptly. Furthermore, at the start of the driving time period T4, the driving auxiliary circuit 244 replaces the buffer 242, causing the voltage Vy to decrease abruptly. Therefore, the required driving capability of the buffer 242 is lower than the driving capability of the buffer 202 of FIG. 2.

Variant embodiments related to embodiment 1 are described below. Furthermore, the variant embodiments thus described below are also applicable to embodiment 2 described below.

Variant Embodiment 1

Figure 9:
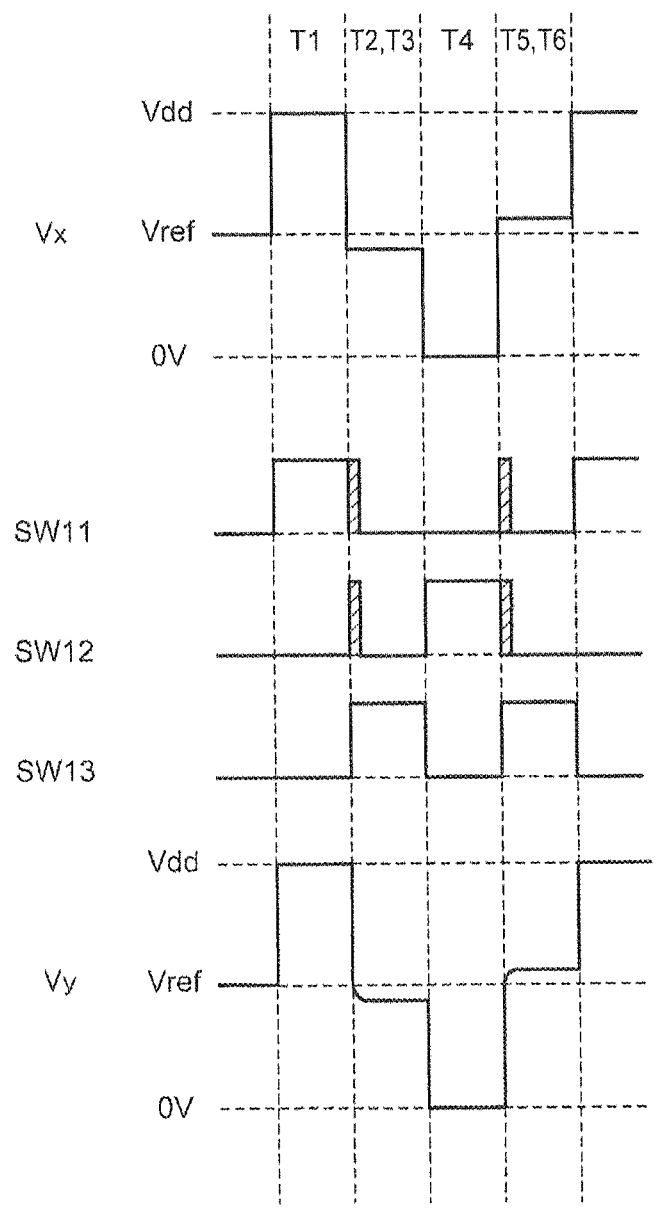
FIG. 9 is an action waveform diagram of the touch detection circuit in variant embodiment 1.

FIG. 9 is an action waveform diagram of the touch detection circuit 200 in variant embodiment 1. In the variant embodiment, the simultaneously-on time period of the first switch SW11 and the second switch SW12 starts immediately after the transition from the driving time period T1 to the transmission time period T2. When the first switch SW11 and the second switch SW12 are equal in on-resistance, the driving auxiliary circuit 244 enables the voltage Vy of the second terminal Pc to instantaneously decrease to midpoint voltage (i.e., standard voltage Vref) of Vdd and 0 V. When both the first switch SW11 and the second switch SW12 are turned off, the buffer 242 enables the voltage Vy of the second terminal Pc to equal the voltage Vx of the first terminals Ps.

Likewise, the simultaneously-on time period of the first switch SW11 and the second switch SW12 starts immediately after the transition from the driving time period T4 to the transmission time period T5. Therefore, the driving auxiliary circuit 244 enables the voltage Vy of the second terminal Pc to instantaneously increase to midpoint voltage (i.e., standard voltage Vref) of Vdd and 0 V. When both the first switch SW11 and the second switch SW12 are turned off, the buffer 242 enables the voltage Vy of the second terminal Pc to equal the voltage Vx of the first terminals Ps.

In the variant embodiment, at the end of the driving time period T1, the voltage Vy is decreased abruptly by the driving auxiliary circuit 244 rather than the buffer 242. Furthermore, at the end of the driving time period T4, the voltage Vy is increased abruptly by the driving auxiliary circuit 244 rather than the buffer 242. Therefore, the required driving capability of the buffer 242 further diminishes, reducing circuit area and power consumption.

Variant Embodiment 2

Figure 10:
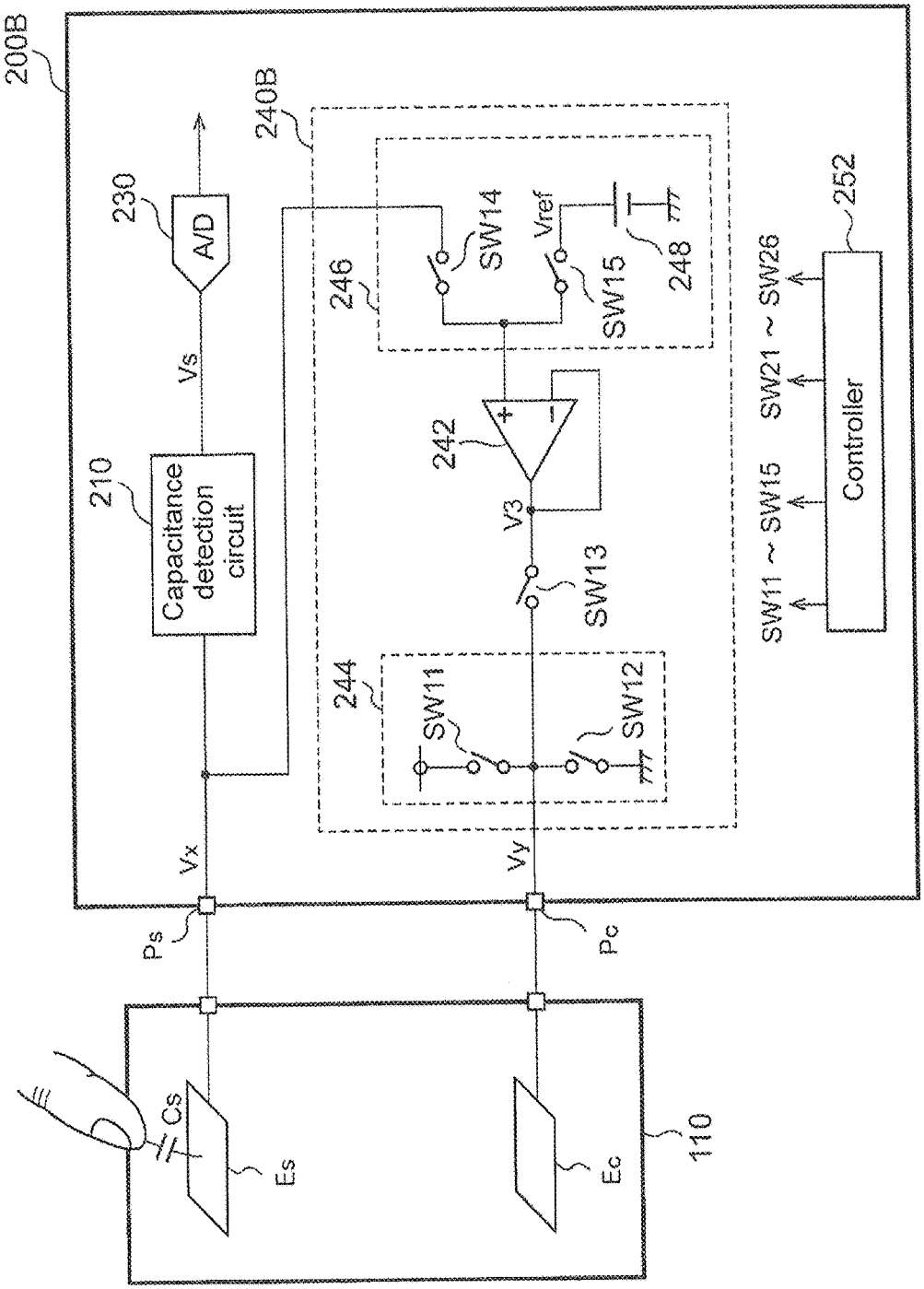
FIG. 10 is a circuit diagram of the touch detection circuit in variant embodiment 2.

FIG. 10 is a circuit diagram of the touch detection circuit 200B in variant embodiment 2. The cancelling circuit 240B not only comprises the cancelling circuit 240A of FIG. 6 but also comprises a voltage bias circuit 246. When the driving auxiliary circuit 244 is in off state (inactivated state, i.e., when both SW11 and SW12 are turned off), the voltage bias circuit 246 provides a bias voltage (voltage Vbias) to the input of the buffer 242. The bias voltage (voltage Vbias) is ideally equal to standard voltage Vref or configured to approximate to standard voltage Vref.

The voltage bias circuit 246 comprises a fourth switch SW14, a fifth switch SW15, and a voltage source 248. For example, given Vbias=Vdd/2, the voltage source 248 is implemented as a resistance voltage biasing circuit which performs voltage biasing on power supply voltage Vdd according to a voltage biasing ratio of 1/2. The fourth switch SW14 is disposed between the input of the buffer 242 and the first terminals Ps. Furthermore, the fifth switch SW15 is disposed between the input of the buffer 242 and the voltage source 248.

Figure 11:
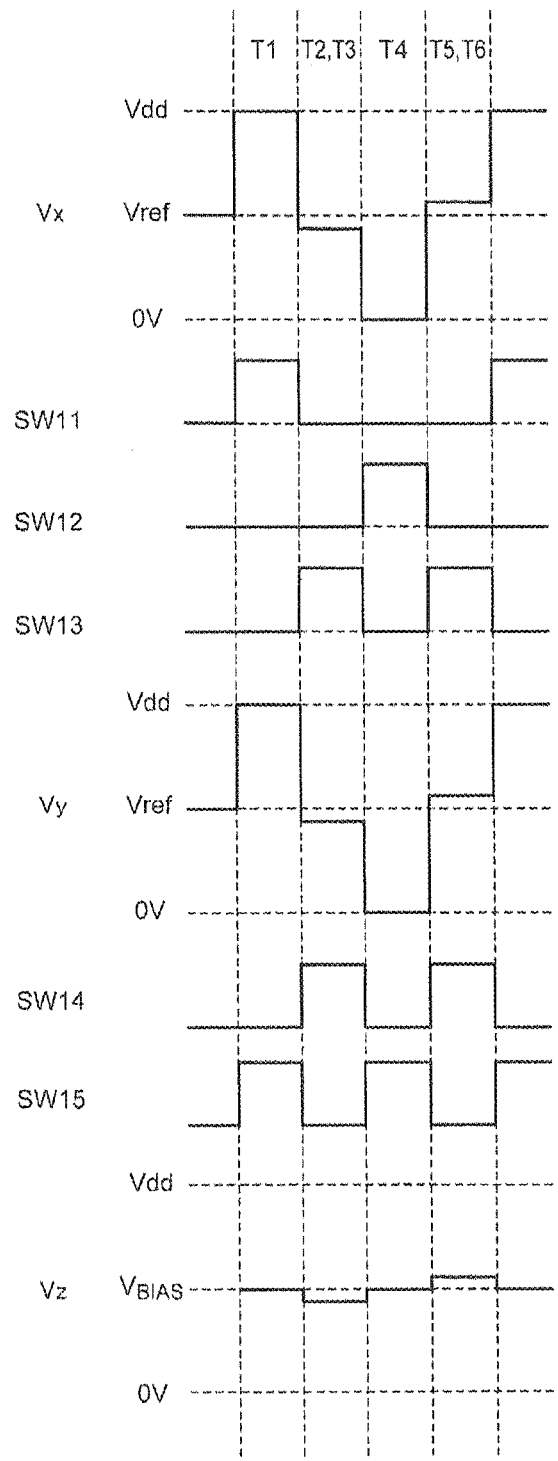
FIG. 11 is an action waveform diagram of the touch detection circuit of FIG. 10.

FIG. 11 is an action waveform diagram of the touch detection circuit 200B of FIG. 10. In FIG. 11, output voltage Vz of the buffer 242 is showed. During the driving time periods T1, T4, the fourth switch SW14 is turned off, and the fifth switch SW15 is turned on. As a result, output voltage Vz of the buffer 242 stays at the bias voltage (voltage Vbias). During the transmission time periods T2, T5 and the amplification time periods T3, T6, the fourth switch SW14 is turned on, and the fifth switch SW15 is turned off, the output voltage Vz of the buffer 242 is equal to the voltage Vx.

Therefore, variant embodiment 2 is effective in reducing the range of variation in output voltage Vz of the buffer 242. Therefore, the driving capability of the buffer 242 further diminishes, reducing circuit area and power consumption.

Variant Embodiment 3

Figure 12:
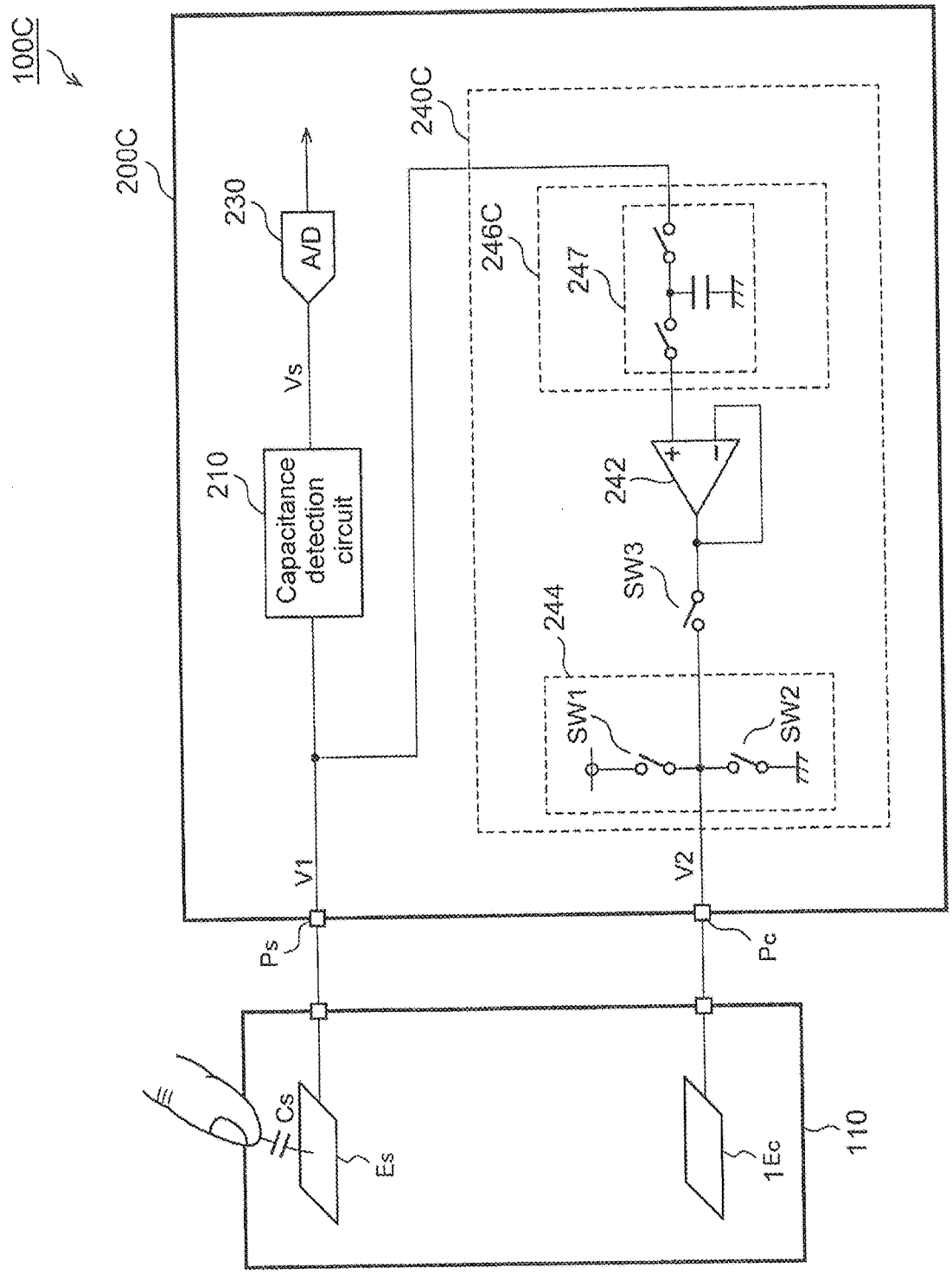
FIG. 12 is a circuit diagram of the touch detection circuit in variant embodiment 3.

FIG. 12 is a circuit diagram of the touch detection circuit 200C in variant embodiment 3. The voltage bias circuit 246C of the cancelling circuit 240C comprises a sample maintaining circuit 247. The sample maintaining circuit 247 performs sampling on the voltage Vx of the first terminals Ps during the transmission time period T2 (T5) and the amplification time period T3 (T6) and maintains the samples. During the driving time periods T1, T4, the voltage bias circuit 246C outputs the maintained voltage as the bias voltage (voltage Vbias). During the transmission time period T2 (T5) and the amplification time period T3 (T6), the voltage Vx of the first terminals Ps is outputted.

Embodiment 2

Figure 13:
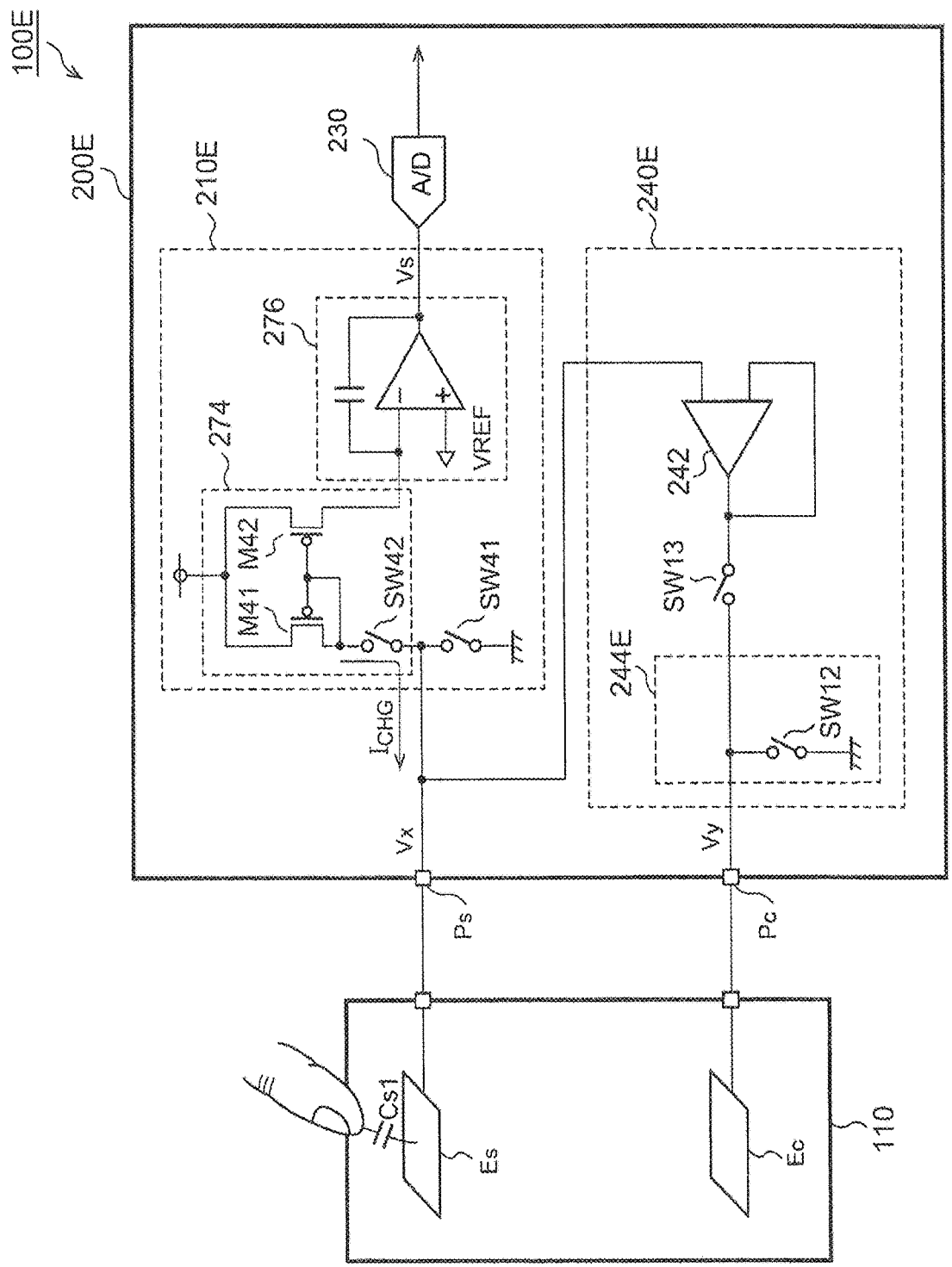
FIG. 13 is a circuit diagram of the touch detection circuit in embodiment 2.

FIG. 13 is a circuit diagram of the touch detection circuit 200E in embodiment 2. The first capacitance detection circuit 210E differs from the first capacitance detection circuit 210A of FIG. 6. The first capacitance detection circuit 210E comprises a reset switch SW41, a current mirroring circuit 274, and an integrator 276.

The reset switch SW41 is disposed between the first terminals Ps and the ground line. The transistor M41 on the input side of the current mirroring circuit 274 is connected to the first terminals Ps. The current mirroring circuit 274 comprises a sensing switch SW42. The integrator 276 outputs detection voltage Vs generated as a result of integration of the current Is flowing in the transistor M42 on the output side of the current mirroring circuit 274.

Figure 14:
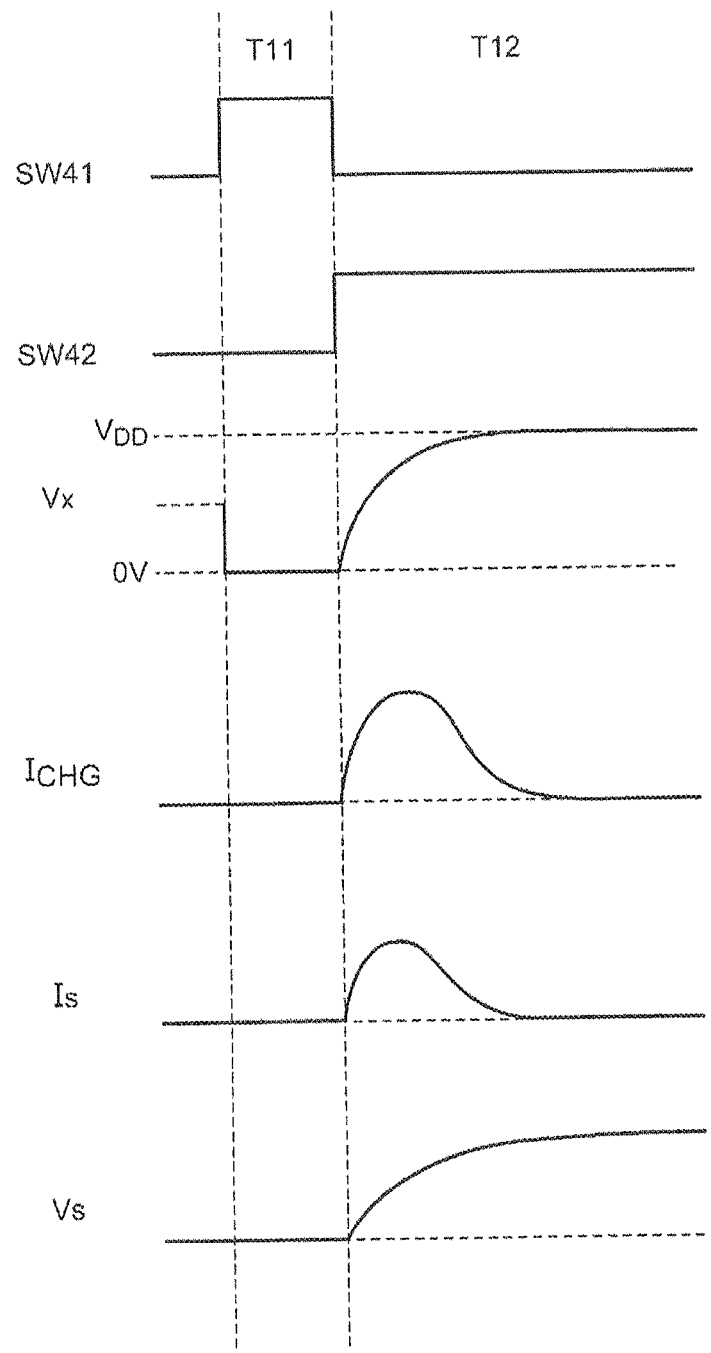
FIG. 14 is an action waveform diagram of a first capacitance detection circuit of FIG. 13.

FIG. 14 is an action waveform diagram of a first capacitance detection circuit 210E of FIG. 13. In a reset time interval T11, the reset switch SW41 is turned on such that 0 V is applied to the first terminals Ps, and electrostatic capacitance Cs discharges. After that, in a sensing time interval T12, the sensing switch SW42 is turned on such that charging current $I_{CHG}$ starts flowing to the transistors on the input side of the current mirroring circuit 274, thereby electrostatic capacitance Cs is charged with charging current $I_{CHG}$. Then, when the voltage Vx increases to power supply voltage Vdd approximately, the transistor M41 on the input side of the current mirroring circuit 274 enters cutoff mode, and charging pauses. The variation amplitude ΔV of the voltage Vx is substantially equal to power supply voltage Vdd. At this point, total charge Q which has flowed into electrostatic capacitance Cs is expressed by the equation as follows:

$$Q = Cs \times \Delta V = Cs \times Vdd$$

The current mirroring circuit 274 replicates charging current $I_{CHG}$, and then the integrator 276 adds up the replicate current Is. The output voltage Vs has voltage variation which is proportional to the total charge Q, that is, proportional to electrostatic capacitance Cs.

Referring to FIG. 13, the cancelling circuit 240E enables the voltage Vy of the second terminal Pc to follow the voltage Vx variation shown in FIG. 14. When the reset switch SW41 is turned on, the voltage Vx varies abruptly. The driving auxiliary circuit 244E causes the abrupt variation, using the buffer 242 to produce gradual variation in the voltage Vx after the sensing switch SW42 has been on. Under the aforesaid condition, the driving auxiliary circuit 244E may comprise the second switch SW12 disposed between the second terminal Pc and the ground.

Figure 15:
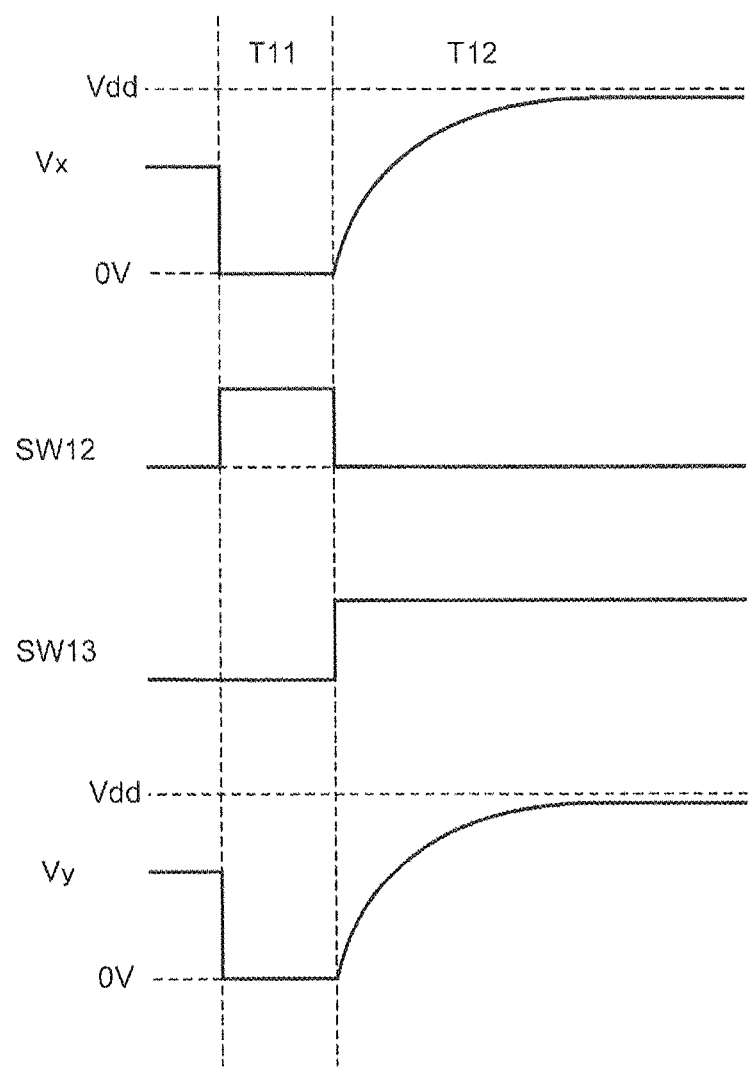
FIG. 15 is an action waveform diagram of the touch detection circuit of FIG. 13.

FIG. 15 is an action waveform diagram of the touch detection circuit 200E of FIG. 13. In the reset time interval T11, the reset switch SW41 is turned on, decreasing the voltage Vy of the second terminal Pc to 0 V. At the start of the sensing time interval T12, the third switch SW13 is turned on, using the buffer 242 to drive the voltage Vy of the second terminal Pc in such a manner as to render the voltage Vy equal to the voltage Vx.

An action of the touch detection circuit 200E is described above. The touch detection circuit 200E is also effective in achieving the advantages disclosed in embodiment 1.

A variant embodiment related to embodiment 2 is described below. In the touch detection circuit 200E of FIG. 13, the voltage bias circuit 246 is also disposed on the input side of the buffer 242.

Figure 16:
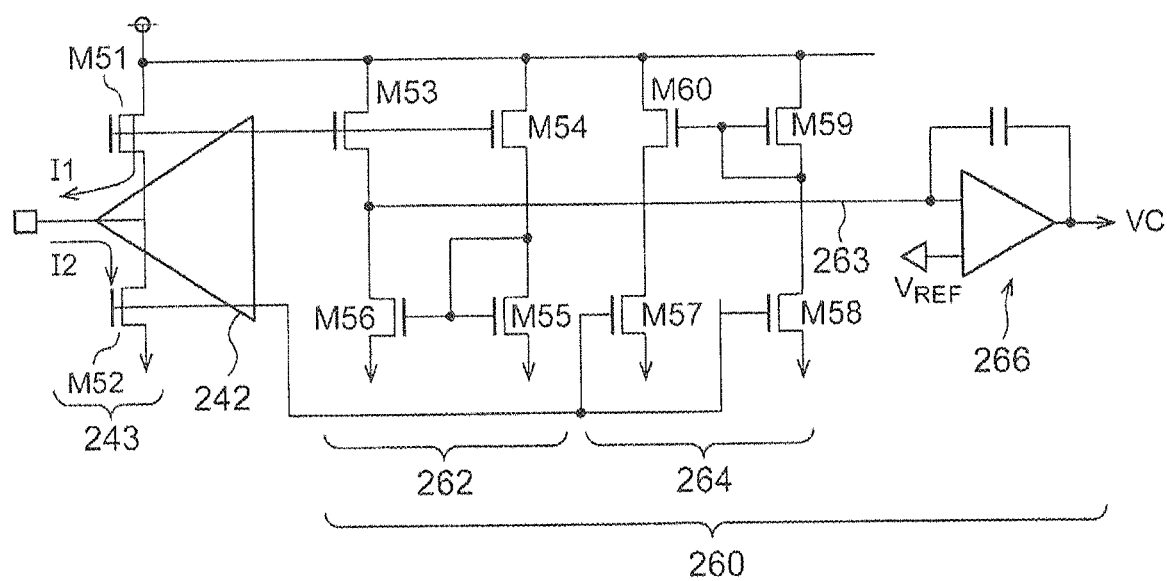
FIG. 16 is a circuit diagram of a second capacitance detection circuit in an embodiment.

The constituent elements of the second capacitance detection circuit 260 are described below. FIG. 16 is a circuit diagram of the second capacitance detection circuit 260 in an embodiment. The buffer 242 includes a push-pull type output section 243. The push-pull type output section 243 comprises a high-side transistor M51 and a low-side transistor M52. An integrating circuit 266 integrates currents I1, I2 flowing within the high-side transistor M51 and the low-side transistor M52 and thereby generates the detection signal Vc.

A first current detection portion 262 comprises transistors M53~M56 such that a current corresponding to the pulling current I1 flowing within the high-side transistor M51 is pulled and/or infused into an input line 263 of an integrating circuit 249. A second current detection portion 264 comprises transistors M57~M60 such that a current corresponding to the infusing current I2 flowing within the low-side transistor M52 is provided and/or infused into the input line 263.

The present disclosure is described above in accordance with the aforesaid embodiments. The aforesaid embodiments serve exemplary purposes. Persons skilled in the art understand that the constituent elements and processing processes in the aforesaid embodiments can be combined to attain various variant embodiments. Furthermore, the variant embodiments also fall within the scope of the present disclosure. The variant embodiments are described below.

The structures of the cancelling circuit 240 and the second capacitance detection circuit 260 in the above description are not restrictive. For example, constituent elements of both the cancelling circuit 240 and the second capacitance detection circuit 260 are similar to constituent elements of the first capacitance detection circuits 210.

Referring to FIG. 3, the second electrode Ec overlaps first electrodes Es, but the present disclosure is not limited thereto. The second electrode Ec may also be coplanar with N first electrodes Es while approaching or surrounding N first electrodes Es1~EsN.

What is claimed is:

1. A touch detection circuit, comprising:
   N (N≥1), first terminals, each connected with a corresponding first electrode;
   a second terminal, connected with a second electrode;
   N first capacitance detection circuits, corresponding to the N first terminals, changing voltages of the first terminals, respectively, and each generating a first detection signal indicating an electrostatic capacitance of the corresponding first electrode in accordance with movement of a charge produced in the corresponding first terminal;
   a cancelling circuit, driving the second terminal in a manner that a voltage of the second terminal follows a voltage of the first terminal; and
   a second capacitance detection circuit, generating a second detection signal indicating an electrostatic capacitance of the second electrode,
   wherein the touch detection circuit is a self-capacitance type touch detection circuit,
   wherein the cancelling circuit includes a buffer having an input receiving the voltages of the first terminals and an output connecting with the second terminal, and the second capacitance detection circuit includes an integrating circuit for integrating an output current of the buffer.

2. The touch detection circuit of claim 1, wherein the second capacitance detection circuit generates the second detection signal in accordance with a movement of a charge produced in the second terminal driven by the cancelling circuit.

3. The touch detection circuit of claim 1, wherein an area of the second electrode is greater than an area of the first electrode.

4. The touch detection circuit of claim 1, wherein the buffer includes a push-pull type output section having a high-side transistor and a low-side transistor, and the integrating circuit integrates currents flowing in the high-side transistor and the low-side transistor, respectively.

5. The touch detection circuit of claim 1, wherein an action parameter and/or an action mode of the touch detection circuit is controlled according to the second detection signal.

6. The touch detection circuit of claim 5, wherein the action parameter is an action frequency of the first capacitance detection circuit.

7. The touch detection circuit of claim 5, wherein the action parameter is a threshold value of a touch detection for the N first electrodes.

8. The touch detection circuit of claim 1, wherein N≥2, and the second electrode is disposed in such a manner as to overlap the N first electrodes.

9. The touch detection circuit of claim 1, wherein N≥2, the N first capacitance detection circuits are activated sequentially with time division, and the N first detection signals are generated sequentially, the non-activated first capacitance detection circuits is synchronized with the activated first capacitance detection circuit and modify the voltages of the corresponding first terminals.

10. The touch detection circuit of claim 1, wherein the touch detection circuit is integrally integrated on a semiconductor integrated circuit.

11. An input device, characterized by comprising:
a panel, having a plurality of sensor electrodes, wherein an electrostatic capacitance of the sensing electrode adjacent to a coordinate touched by a user is changed; and
the touch detection circuit of claim 1, wherein the plurality of sensor electrodes serves as the N first electrodes and connects with the touch detection circuit.

12. An electronic apparatus, comprising:
the input device of claim 11.

* * * * *